United States Patent [19]
Lynch et al.

[11] Patent Number: 4,643,804
[45] Date of Patent: Feb. 17, 1987

[54] FORMING THICK DIELECTRIC AT THE BOTTOMS OF TRENCHES UTILIZED IN INTEGRATED-CIRCUIT DEVICES

[75] Inventors: William T. Lynch, Summit, N.J.; Thomas E. Seidel, Carlsbad, Calif.

[73] Assignee: AT&T Bell Laboratories, Murray Hill, N.J.

[21] Appl. No.: 758,797

[22] Filed: Jul. 25, 1985

[51] Int. Cl.[4] .............................................. C25D 11/02
[52] U.S. Cl. ................................................... 204/15
[58] Field of Search ......................... 204/15, 37.1, 38.3

[56] References Cited

U.S. PATENT DOCUMENTS

| 4,028,149 | 6/1977 | Deines | 204/15 |
| 4,104,090 | 8/1978 | Pogge | 204/15 |
| 4,459,181 | 7/1984 | Benjamin | 204/15 |

OTHER PUBLICATIONS

*IEEE Transactions on Electron Device*, vol. ED-27, No. 8, "Selective Anodic Oxidation of Silicon in Oxygen Plasma", by V. Q. Ho et al, pp. 1436–1443, Aug. 1980.
*IEEE Transactions on Electron Devices*, vol. ED-32, No. 2, Feb. 1985, "Anodic Oxidation of Si in Oxygen/Chlorine Plasma", by N. Haneji et al, pp. 100–105.

*Primary Examiner*—T. M. Tufariello
*Attorney, Agent, or Firm*—Lucian C. Canepa

[57] ABSTRACT

Selective wet or plasma anodization is utilized for forming a relatively thick dielectric layer only at the bottoms of trenches included in DRAM and/or CMOS devices. In that way, the electrical characteristics of trenches that include bottoms having surface roughness and/or sharp or irregular corners are significantly improved. Additionally, electrically isolated capacitor structures in elongated trenches formed in DRAM devices are thereby made feasible.

14 Claims, 7 Drawing Figures

FORMING THICK DIELECTRIC AT THE BOTTOMS OF TRENCHES UTILIZED IN INTEGRATED-CIRCUIT DEVICES

BACKGROUND OF THE INVENTION

This invention relates to integrated-circuit devices and, more particularly, to a method for fabricating trenches in such devices.

It is known to utilize microminiature trenches in integrated-circuit devices for various purposes. In dynamic random-access memory (DRAM) devices, trenches having a thin dielectric layer formed on the walls and bottoms thereof serve as the basis for making high-capacitance memory cell capacitors in a relatively small area. In complementary metal-oxide-semiconductor (CMOS) devices, dielectric-filled trenches are utilized to achieve isolation between adjacent n-channel and p-channel transistor regions thereby to achieve latchup-free operation of the devices. Such isolation trenches include, for example, a composite filling including a thin high-quality dielectric formed directly on the trench walls.

In practice, the bottoms of typical trenches formed in integrated-circuit devices often exhibit imperfections such as surface roughness and/or sharp or irregular corners. In turn, these imperfections can lead to undesirable current leakage and/or voltage breakdown problems in the devices.

One solution to the problems that such imperfections cause is to form a thicker dielectric layer on the bottoms than on the sides of the trenches. But, heretofore, no satisfactory practical technique for forming such a thick dielectric has been available.

Accordingly, efforts have been directed by workers in the art aimed at trying to devise a simple and effective method of forming a relatively thick dielectric layer only on the bottom surfaces of trenches included in integrated-circuit devices. It was realized that such efforts, if successful, had the potential for significantly improving the electrical characteristics of devices that include trenches having less-than-ideal bottom contours.

Additionally, it has been recognized that the ability to form a thick dielectric layer only at the bottom of a trench is the basis for achieving an advantageous new DRAM device in which electrically isolated capacitors are fabricated on the respective facing sidewalls of an elongated trench. A specific illustrative trench structure that is thereby made feasible is described in a commonly owned application designated Ser. No. 758,885 which is being filed concurrently herewith.

SUMMARY OF THE INVENTION

Hence, an object of the present invention is an improved integrated-circuit device. More specifically, an object of this invention is a fabrication procedure for forming a thick dielectric layer only at the bottom of a trench included in such a device.

Briefly, these and other objects of the present invention are realized in a specific illustrative integrated-circuit device that includes a silicon body that includes a p+-type region. A trench is formed in the body to expose a portion of the p+ region at the bottom of the trench. Next, the top of the structure and the sidewalls and bottom of the trench are coated with a protective layer. In an etching step, the protective layer on the bottom is then removed. Subsequently, a selective anodization procedure is carried out. In one embodiment, the exposed p+ region at the bottom of the trench is etched and rendered porous in a wet anodization step. The porous silicon is then oxidized to form a thick layer of silicon dioxide. In another embodiment, the exposed p+ region is selectively converted to silicon dioxide in a one-step dry anodization procedure carried out in a plasma. In either case, the protective layer on the trench sidewalls is then removed and replaced either with a thin dielectric layer or with a material that serves as a dopant source, as will be described in detail later below.

BRIEF DESCRIPTION OF THE DRAWING

A complete understanding of the present invention and of the above and other features and advantages thereof may be gained from consideration of the following detailed description presented hereinbelow in connection with the accompanying drawing, not drawn to scale, in which.

DETAILED DESCRIPTION

Figure 1:
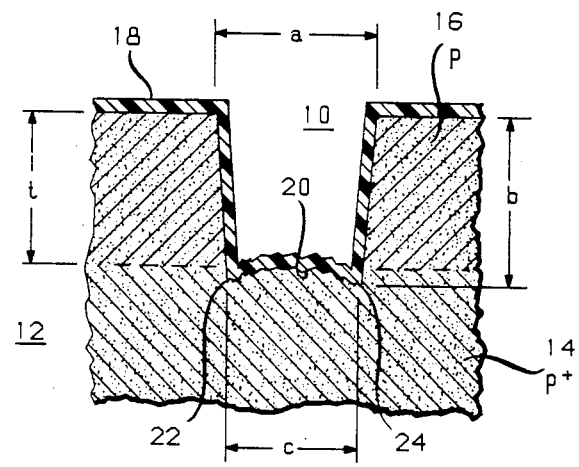
FIG. 1 shows a conventional integrated-circuit device having a standard trench formed therein.

FIG. 1 illustrates some of the problems typically encountered when a thin dielectric layer is applied to the surfaces of a microminiature trench formed in an integrated-circuit device. By way of example, FIG. 1 shows a conventional trench 10 that has dimensions a, b, and c of approximately 1.25, 4.0 and 0.5 micrometers ($\mu$m), respectively. The trench 10 is formed in a silicon body 12 that comprises a portion of a DRAM or CMOS device. The body 12 comprises, for example, a p+ region 14 having thereon a p-type epitaxial layer 16 having a thickness t of about 3.5 $\mu$m.

Illustratively, the aforementioned thin dielectric layer comprises a 200-Angstrom-unit (Å)-thick coating 18 of deposited or grown silicon dioxide. The coating 18 constitutes, for example, the dielectric of a trench capacitor included in a very-large-scale-integrated (VLSI) DRAM device. In such a device, a conductive material (not shown) is utilized to provide a capacitor plate over the thin dielectric.

Alternatively, the coating 18 of FIG. 1 is designed, for example, to be the high-quality component of a two-layer dielectric utilized to form isolation trenches in a CMOS device. (For such use, the coating 18 is, for example, about 500-to-1200 Å thick.) In practice, another material of lower dielectric quality (not shown) is utilized to fill the coated trench to the top. The overall dielectric properties of the resulting isolation trench are thus largely dependent on the characteristics of the thin coating 18.

A microminiature trench of the type represented in FIG. 1 often includes imperfections at the bottom thereof. These include, for example, surface irregularities 20 and/or sharp or irregular corners 22 and 24. Grown oxide layers are also thinner at the corners of silicon steps. As a result, the dielectric coating 18 often exhibits high-current-leakage and/or low-voltage-breakdown regions at these imperfections. In turn, this typically degrades the operating characteristics of the device of which the trench 10 comprises a constituent part.

In accordance with the principles of the present invention, a relatively thick dielectric layer is formed at the bottom of the trench 10 of FIG. 1. The aforementioned deleterious effects arising from trench-bottom imperfections are thereby avoided or substantially alleviated. A unique fabrication sequence for forming such a thick layer at the bottom of the trench 10 is described in detail below.

In some integrated-circuit devices, a thick dielectric layer at the bottom of a trench is desired regardless of whether or not the trench bottom has imperfections of the type specified above. Thus, for example, in a DRAM device of the type described in the aforecited commonly owned application being filed concurrently herewith, such a thick dielectric layer at the bottom of an elongated trench is the basis for forming electrically isolated capacitors on the respective facing sidewalls of the trench. Applicants' herein-specified fabrication sequence is an attractive way of achieving such electrical isolation.

Figure 2:
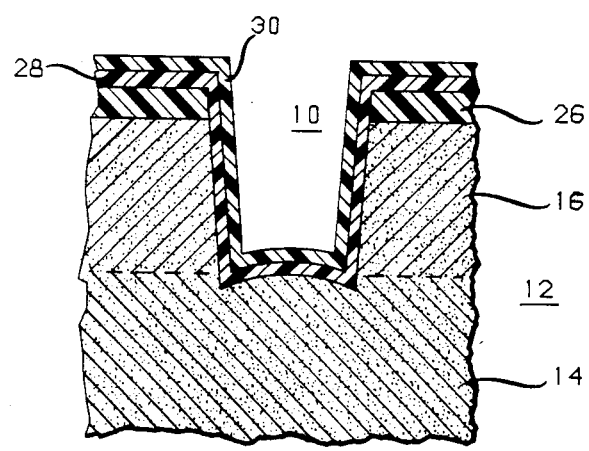
FIGS. 2 through 7 depict portions of an integrated-circuit device at successive stages of a specific illustrative trench fabrication sequence carried out in accordance with the principles of the present invention.

FIG. 2 shows a trench 10 identical to the aforedescribed one include in FIG. 1. Additionally, by way of example, body 12, p+ region 14 and p layer 16 of FIG. 2 are identical to the correspondingly numbered elements of FIG. 1.

In accordance with applicants' inventive principles, a series of masking layers are initially formed on the top surface of the body 12 (FIG. 2) and on the side and bottom surfaces of the trench 10. Illustratively, these layers comprise a 1000-Å-thick layer 26 of silicon dioxide (or a suitable composite mask) formed only on the top surface of the body 12 and layers 28 and 30 overlying the layer 26 and covering all the surfaces of the trench 10. By way of example, the layer 28 comprises a 300-Å-thick layer of silicon dioxide and the layer 30 comprises a 1000-Å-thick layer of silicon nitride. Various conventional ways are known in the art for forming these layers.

Figure 3:
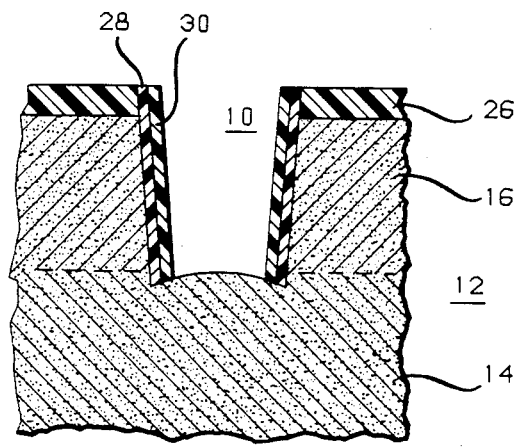

Subsequently, by means of standard reactive ion etching (RIE) techniques, the top surface of the body 12 and the surfaces of the trench 10 are anisotropically etched. This is done in known ways by utilizing, for example, a plasma derived from $CHF_3$ for sequentially removing portions of the layers 30 and 28, respectively. Because of the near-vertical nature of the sidewalls of the trench 10, the portions of the layers 28 and 30 on the trench sidewalls are substantially unaffected during the RIE process. By contrast, the portions of the layers 28 and 30 on the top surface of the body 12 and on the bottom surface of the trench are thereby etched away. At that point, the structure appears as shown in FIG. 3. The layer 26 remains to mask the top surface of the body 12 and portions of the layers 28 and 30 remain to mask the trench sidewalls.

It has been known since at least 1958 that porous silicon can be produced by anodically biasing a silicon semiconductor in an electrolyte of hydrofluoric acid. In the presence of holes at the silicon surface, silicon and hydrofluoric acid react to produce silicon fluoride and hydrogen. This reaction is therefore enhanced for p-type silicon and/or by illuminating the silicon surface. The removal of silicon atoms leaves dangling bonds. In turn, atoms with dangling bonds are less likely to react with the hydrofluoric acid. The etchant therefore selectively reacts with bound atoms. Ultimately, this produces a porous silicon matrix that retains much of its crystalline order even though 50-to-60 percent or even more of the silicon atoms may be etched. The porous silicon structure permits extremely rapid oxidation in the presence of oxygen at high temperatures.

Despite this general prior knowledge of the technique of selective anodization, it was not obvious to have thought of applying the known technique to the particular and vexing problem of forming a relatively thick dielectric layer only at the bottom of a microminiature trench. Only applicants recognized the unique applicability of the known technique to the noted problem. By so doing, applicants have made a noteworthy and significant contribution to the design of highly reliable integrated-circuit devices.

Next, in accordance with the principles of the present invention, the exposed p+-type region at the bottom of the trench 10 shown in FIG. 3 is anodized. This is done, for example, in a wet anodization procedure in which about one-half of the silicon material in the affected region is removed thereby leaving a porous silicon matrix in the anodized p+ region. Subsequently, the porous silicon is oxidized to form a silicon dioxide region.

Figure 4:
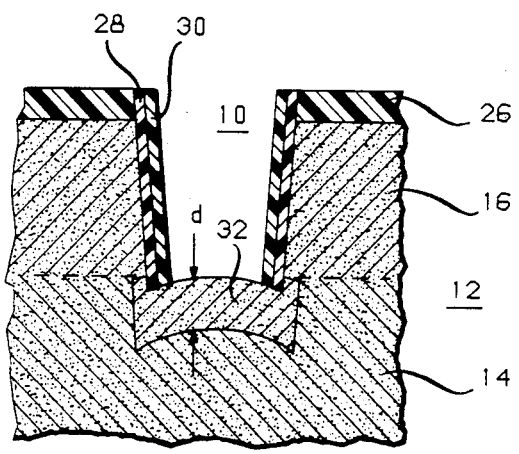

More specifically, anodization is accomplished by immerising the entire device structure represented by FIG. 3 in an electrolyte containing, for example, 5 percent hydrofluoric acid in a 1:1 solution of acetic acid and water. The device structure is connected to the positive terminal of a d-c power supply to whose negative terminal a platinum electrode is connected. By passing approximately 0.75 milliamperes per square centimeter through the electrolyte for about 10 minutes, the region 32 depicted in FIG. 4 is etched and rendered porous. In one specific illustrative example, the thickness d of the porous region 32 was approximately 2000 Å. The final density of the porous silicon is a function both of the anodic current density (more porous for higher current density) and of the initial doping of the affected region (more porous for higher p doping).

Oxidation of substantially all of the porous silicon region 32 (FIG. 4) is then carried out by exposing the device structure to oxygen in, for example, a furnace at about 900 degrees Celsius for about 5 minutes or by carrying out a rapid-thermal-annealing (RTA) step at approximately 1050 degrees Celsius for about 60 seconds. The resulting silicon dioxide region occupies about the same volume as the silicon that was anodized and made porous. As a result, the insulating region thereby formed is substantially stress-free.

Figure 5:
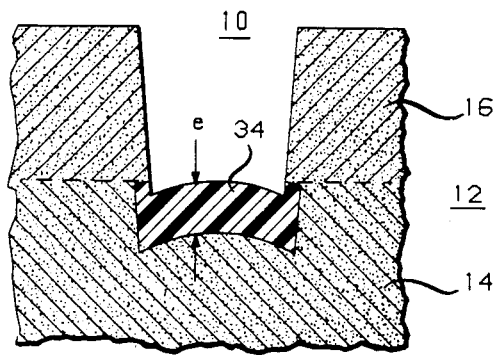

Subsequently, the silicon nitride masking layer 30 (FIG. 4) on the trench sidewalls is removed by etching the depicted structure with, for example, hot phosphoric acid. The silicon dioxide layer 28 and all or part of the layer 26 are then removed from the structure by utilizing dilute HF. This also reduces the thickness of the silicon dioxide region at the bottom of the trench. At that point in the fabrication sequence, the structure appears as depicted in FIG. 5. The final thickness e of the trench-bottom oxide region 34 is approximately 1500 Å.

In further accordance with the principles of the present invention, a dry rather than a wet anodization procedure can be utilized to form the trench-bottom silicon dioxide region 34 shown in FIG. 5. In the dry approach, the unmasked p+-type bottom of the trench 10 (see FIG. 3) is converted to silicon dioxide in a one-step anodization procedure carried out in a plasma. Such a dry anodization procedure involves placing the device structure whose p+-type regions are to be converted to silicon dioxide on an anode electrode in a plasma reaction chamber. Either oxygen or a mixture of oxygen and chlorine is introduced into the chamber. A plasma is then generated in the chamber. The properties of the resulting oxide formed on unmasked p- or p+-type silicon portions of the structure are comparable to those of thermally grown oxide.

Further details of one-step dry anodization procedures of the type described above are set forth in "Selective Anodic Oxidation of Silicon in Oxygen Plasma" by V. Q. Ho et al, *IEEE Transactions on Electron Devices,* Vol. ED-27, No. 8, August 1980, pages 1436–1443, and in "Anodic Oxidation of Si in Oxygen/Chlorine Plasma" by N. Haneji et al, *IEEE Transactions on Electron Devices, Vol. ED*-32, No. 2, February 1985, pages 100–105. These procedures are suitable for inclusion in applicants' overall inventive process.

Figure 6:
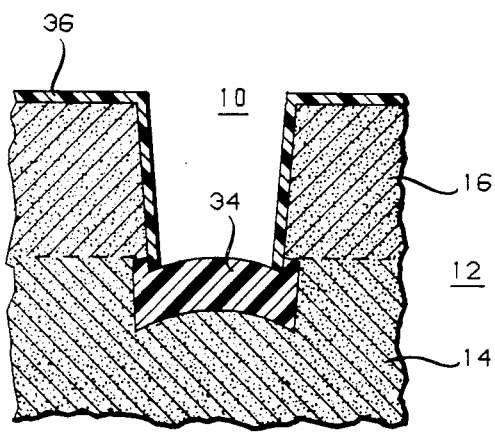

As stated earlier above, a structure of the type represented in FIG. 5 is the basis for fabricating advantageous DRAM and/or CMOS devices. For some such devices, a thin dielectric layer is next formed on the top surface and on the sidewalls and bottom of the trench 10 shown in FIG. 5. Such a layer 36, corresponding to the previously described layer 18 of FIG. 1, is shown in the device structure represented in FIG. 6. Because of the inclusion of the trench-bottom region 34 in the FIG. 6 structure, the electrical characteristics of the resulting dielectric layer 36 are substantially better than those of the layer 18 of FIG. 1. In particular, the dielectric depicted in FIG. 6 exhibits significantly improved leakage and breakdown characteristics. Thus, complete packaged devices made from the structure shown in FIG. 6 constitute meritorious improvements in integrated-circuit devices.

Figure 7:
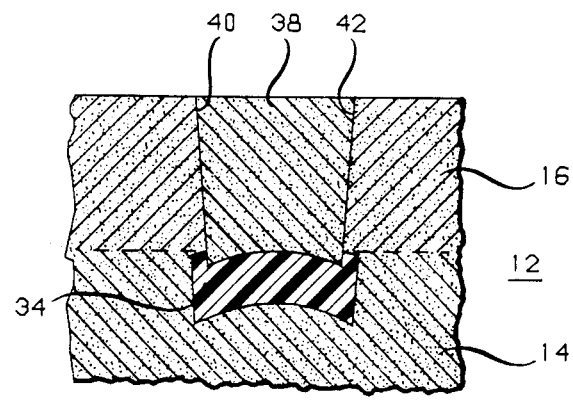

Additionally, as also indicated earlier above, a structure of the type represented in FIG. 5 is the basis for making a unique DRAM device of the type having an elongated trench in which multiple electrically isolated capacitors are formed on the respective facing sidewalls thereof. The trench-bottom region 34 of FIG. 5 provides such isolation during fabrication steps in which a dopant source is formed in spaced-apart portions of the elongated trench. One such dopant-source portion 38 (made, for example, of phosphorous-doped silicon dioxide, so-called P-glass) is depicted in FIG. 7. During a subsequent heating step in which n-type dopant is driven from the portion 38 into the p-type sidewalls of the trench 10 as part of the capacitor fabrication procedure, the region 34 acts as a barrier to block such dopant from reaching the portion of the region 14 that underlies the region 34, as described in detail in the aforecited Lynch application. In that way, effective electrical isolation is maintained between the capacitors being formed on the respective facing sidewalls 40 and 42 of the trench 10.

Thus, in the unique manner specified in detail herein, microminiature trenches included in integrated-circuit devices are processed to form relatively thick dielectric layers only at the bottoms thereof. In accordance with applicants' invention, this is done either in a two-step wet anodization sequence or in a one-step dry anodization procedure. In either case, anodization is the basis for fabricating improved trench structures in DRAM and/or CMOS devices.

Finally, it is to be understood that the above-described structures and processing techniques are only illustrative of the principles of the present invention. In accordance with these principles, numerous modifications and alternatives may be devised by those skilled in the art without departing from the spirit and scope of the invention. Thus, for example, although primary emphasis herein has been directed to specific trenches whose bottoms extend into p+ regions of integrated-circuit device structure, it is to be understood that applicants' inventive principles are not limited thereto. These principles extend also to trenches whose bottoms extend into p regions of integrated-circuit devices. Or if the trench bottoms extend into device regions that are not ordinarily p-type, the regions may be so converted for purposes of applicants' inventive procedure by first introducing therein a p-type dopant such as boron. Moreover, applicants' inventive principles may even be extended to trench bottoms that extend into n-type regions. This is done by illuminating the trench bottoms to generate holes.

What is claimed is:

1. A method of fabricating an integrated-circuit device in a silicon body, comprising the steps of
   forming a trench in said body,
   forming a mask on the top surface of said body and on the sidewalls of said trench.
   and forming a dielectric layer only at the bottom of said trench in a fabrication procedure that includes anodization.

2. A method as in claim 1 wherein anodization comprises a wet process in which only said trench bottom is rendered porous.

3. A method as in claim 2 wherein said porous trench bottom is then oxidized to form a relatively thick layer of silicon dioxide.

4. A method as in claim 3 wherein the region of said body at the bottom of said trench comprises p-type silicon.

5. A method as in claim 4 wherein said wet anodization process comprises immersing said body in an electrolytic bath that includes hydrofluoric acid in a solution of acetic acid and water.

6. A method as in claim 1 wherein anodization comprises a dry process carried out in a plasma in a one-step process in which only said trench bottom is converted directly to a relatively thick layer of silicon dioxide.

7. A method as in claim 6 wherein the region of said body at the bottom of said trench comprises p-type silicon.

8. A method as in claim 5 further including the steps of
   removing said mask,
   and forming a relatively thin layer of silicon dioxide on the sidewalls of said trench and on the bottom of said trench overlying said relatively thick layer of silicon dioxide.

9. A method as in claim 5 further including the steps of
   removing said mask,
   and filling at least portions of said trench with dopant-source material, said material being in contact with the sidewalls of said trench portions and overlying the relatively thick layer of silicon dioxide on the bottom of said trench portions.

10. A method as in claim 7 further including the steps of
    removing said mask,
    and forming a relatively thin layer of silicon dioxide on the sidewalls of said trench and on the bottom of said trench overlying said relatively thick layer of silicon dioxide.

11. A method as in claim 7 further including the steps of removing said mask, and filling at least portions of said trench with a dopant-source material, said material being in contact with the sidewalls of said trench portions and overlying the relatively thick layer of silicon dioxide on the bottom of said trench portions.

12. A device made by the method of claim 1.
13. A device made by the method of claim 9.
14. A device made by the method of claim 11.

* * * * *